United States Patent
Sant

(10) Patent No.: US 7,972,471 B2
(45) Date of Patent: Jul. 5, 2011

(54) INDUCTIVELY COUPLED DUAL ZONE PROCESSING CHAMBER WITH SINGLE PLANAR ANTENNA

(75) Inventor: Sanket P. Sant, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1006 days.

(21) Appl. No.: 11/819,898

(22) Filed: Jun. 29, 2007

(65) Prior Publication Data

US 2009/0004874 A1    Jan. 1, 2009

(51) Int. Cl.
*H01L 21/306* (2006.01)
*C23C 16/00* (2006.01)

(52) U.S. Cl. ........... 156/345.48; 118/723 I; 118/723 AN

(58) Field of Classification Search ............... 118/723 I, 118/723 IR, 723 AN; 156/345.48, 345.49; 315/111.51
See application file for complete search history.

(56) References Cited

U.S. PATENT DOCUMENTS

| | | |
|---|---|---|
| 4,948,458 A | 8/1990 | Ogle |
| 5,261,962 A | 11/1993 | Hamamoto et al. |
| 5,262,029 A | 11/1993 | Erskine et al. |
| 5,309,063 A | 5/1994 | Singh |
| 5,330,615 A | 7/1994 | Chu |
| 5,430,355 A | 7/1995 | Paranjpe |
| 5,513,765 A | 5/1996 | Usui |
| 5,518,572 A | 5/1996 | Kinoshita et al. |
| 5,556,521 A * | 9/1996 | Ghanbari ............ 204/192.32 |
| 5,571,366 A * | 11/1996 | Ishii et al. ............ 156/345.26 |
| 5,811,022 A | 9/1998 | Savas et al. |
| 5,820,723 A | 10/1998 | Benjamin et al. |
| 5,838,529 A | 11/1998 | Shufflebotham et al. |
| 5,863,376 A | 1/1999 | Wicker et al. |
| 6,083,344 A | 7/2000 | Hanawa et al. |
| 6,132,517 A | 10/2000 | Sivaramakrishnan et al. |
| 6,140,612 A | 10/2000 | Husain et al. |
| 6,143,129 A | 11/2000 | Savas et al. |
| 6,184,158 B1 | 2/2001 | Shufflebotham et al. |
| 6,230,651 B1 | 5/2001 | Ni et al. |
| 6,251,793 B1 | 6/2001 | Wicker et al. |
| 6,379,576 B2 | 4/2002 | Luo et al. |
| 6,395,641 B2 | 5/2002 | Savas |
| 6,518,195 B1 | 2/2003 | Collins et al. |
| 6,536,449 B1 | 3/2003 | Ranft et al. |
| 6,551,447 B1 | 4/2003 | Savas et al. |

(Continued)

OTHER PUBLICATIONS

International Search Report and Written Opinion mailed Dec. 30, 2008 for PCT/US2008/007821.

*Primary Examiner* — Luz L. Alejandro
(74) *Attorney, Agent, or Firm* — Buchanan Ingersoll & Rooney PC

(57) ABSTRACT

A dual zone plasma processing chamber is provided. The plasma processing chamber includes a first substrate support having a first support surface adapted to support a first substrate within the processing chamber and a second substrate support having a second support surface adapted to support a second substrate within the processing chamber. One or more gas sources in fluid communication with one or more gas distribution members supply process gas to a first zone adjacent to the first substrate support and a second zone adjacent to the second substrate support. A radio-frequency (RF) antenna adapted to inductively couple RF energy into the interior of the processing chamber and energize the process gas into a plasma state in the first and second zones. The antenna is located between the first substrate support and the second substrate support.

14 Claims, 4 Drawing Sheets

U.S. PATENT DOCUMENTS

| | | |
|---|---|---|
| 6,706,142 B2 | 3/2004 | Savas et al. |
| 6,830,622 B2 | 12/2004 | O'Donnell et al. |
| 6,893,907 B2 | 5/2005 | Maydan et al. |
| 6,962,644 B2 | 11/2005 | Paterson et al. |
| 7,037,813 B2 | 5/2006 | Collins et al. |
| 2001/0019903 A1 | 9/2001 | Shufflebotham et al. |

* cited by examiner

INDUCTIVELY COUPLED DUAL ZONE PROCESSING CHAMBER WITH SINGLE PLANAR ANTENNA

BACKGROUND

Plasma processing apparatuses are used to process substrates by techniques including etching, physical vapor deposition (PVD), chemical vapor deposition (CVD), ion implantation, and resist removal. One type of plasma processing apparatus used in plasma processing includes an external induction antenna. An electromagnetic field is generated in the chamber underlying the antenna to excite a process gas into the plasma state to process substrates in the reaction chamber.

SUMMARY

A dual zone plasma processing chamber is provided. The plasma processing chamber includes a first substrate support having a first support surface adapted to support a first substrate within the processing chamber and a second substrate support having a second support surface adapted to support a second substrate within the processing chamber. One or more gas sources in fluid communication with one or more gas distribution members supply process gas to a first zone adjacent to the first substrate support and a second zone adjacent to the second substrate support. A radio-frequency (RF) antenna adapted to inductively couple RF energy into the interior of the processing chamber and energize the process gas into a plasma state in the first and second zones. The antenna is located between the first substrate support and the second substrate support.

A method of simultaneously processing first and second semiconductor substrates in a plasma processing chamber is provided. A first substrate is placed on a first substrate support and a second substrate on the second substrate support in the dual zone plasma processing chamber. Process gases from the one or more gas sources are discharged into the first zone between the antenna and the first substrate and into the second zone between the antenna and the second substrate. A first plasma is generated from the first process gas in the first zone. A second plasma is generated from the second process gas in the second zone. The first substrate is processed with the first plasma and the second substrate is processed with the second plasma.

DETAILED DESCRIPTION

Inductively coupled plasma processing chambers are generally used for depositing (e.g., plasma enhanced chemical vapor deposition or PECVD) and plasma etching of materials on substrates by supplying process gas into a vacuum chamber at a low pressure (i.e., below 50 mTorr) and the application of radio-frequency (RF) energy to the gas. The substrates can be held in place within the vacuum chamber during processing by substrate holders including mechanical clamps and electrostatic clamps (ESC). For inductively coupled plasma (ICP) systems, an RF antenna is located outside the process chamber and the RF energy is inductively coupled into the chamber through a dielectric window. Such processing systems can be used for a variety of semiconductor processing applications such as etching, deposition, or resist stripping.

Figure 1:
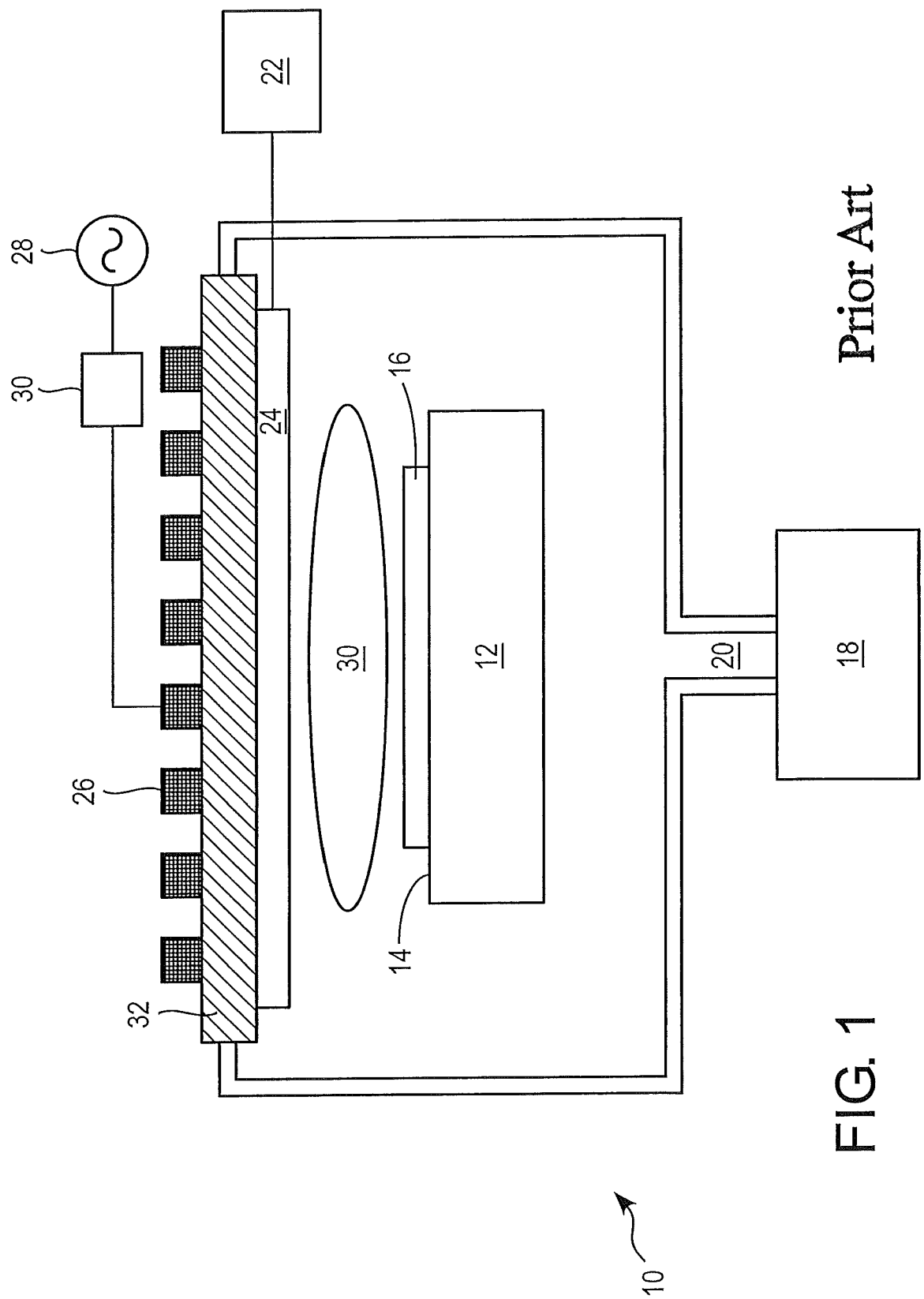
FIG. 1 is a cross-sectional view of an inductively coupled plasma processing apparatus for processing a single substrate.

FIG. 1 is a cross-sectional view of an embodiment of an ICP plasma processing chamber 10. An example of an ICP plasma processing chamber is the TCP® etch or deposition system, manufactured by Lam Research Corporation, Fremont, Calif. The ICP plasma processing chamber is also described, for example, in commonly-owned U.S. Pat. No. 4,948,458, which is incorporated by reference in its entirety. Processing chamber 10 includes a substrate support 12 with support surface 14. The support surface 14 is adapted to support substrate 16. A vacuum pump 18 is attached to pump port 20 to maintain the interior processing chamber 10 at a low pressure (e.g., between about 1 mTorr to about 50 mTorr). A gas source 22 supplies process gases to the interior of processing chamber 10 through a gas distribution plate, showerhead arrangement, injector or other suitable arrangement. Process gases can be introduced by the gas distribution member 24 to a zone adjacent to substrate 16.

Once process gases are introduced into the interior of processing chamber 10, they are energized into a plasma state by an energy source supplying energy into the interior of the processing chamber 10. Preferably, the energy source is an external planar antenna 26 powered by an RF source 28 and RF impedance matching circuitry 30 to inductively couple RF energy into processing chamber 10. An electromagnetic field generated by the application of RF power to planar antenna 26 energizes the process gas to form a high-density plasma 30 (e.g., $10^{11}$-$10^{12}$ ions/cm$^3$) above substrate 16.

A dielectric window 32 underlies planar antenna 26 and forms the top wall of plasma processing chamber 10. The gas distribution member 24 is placed below dielectric window 32. High-density plasma 30 is generated in the zone between gas distribution member 24 and substrate 16, for either deposition or etching of substrate 16.

Figure 2:
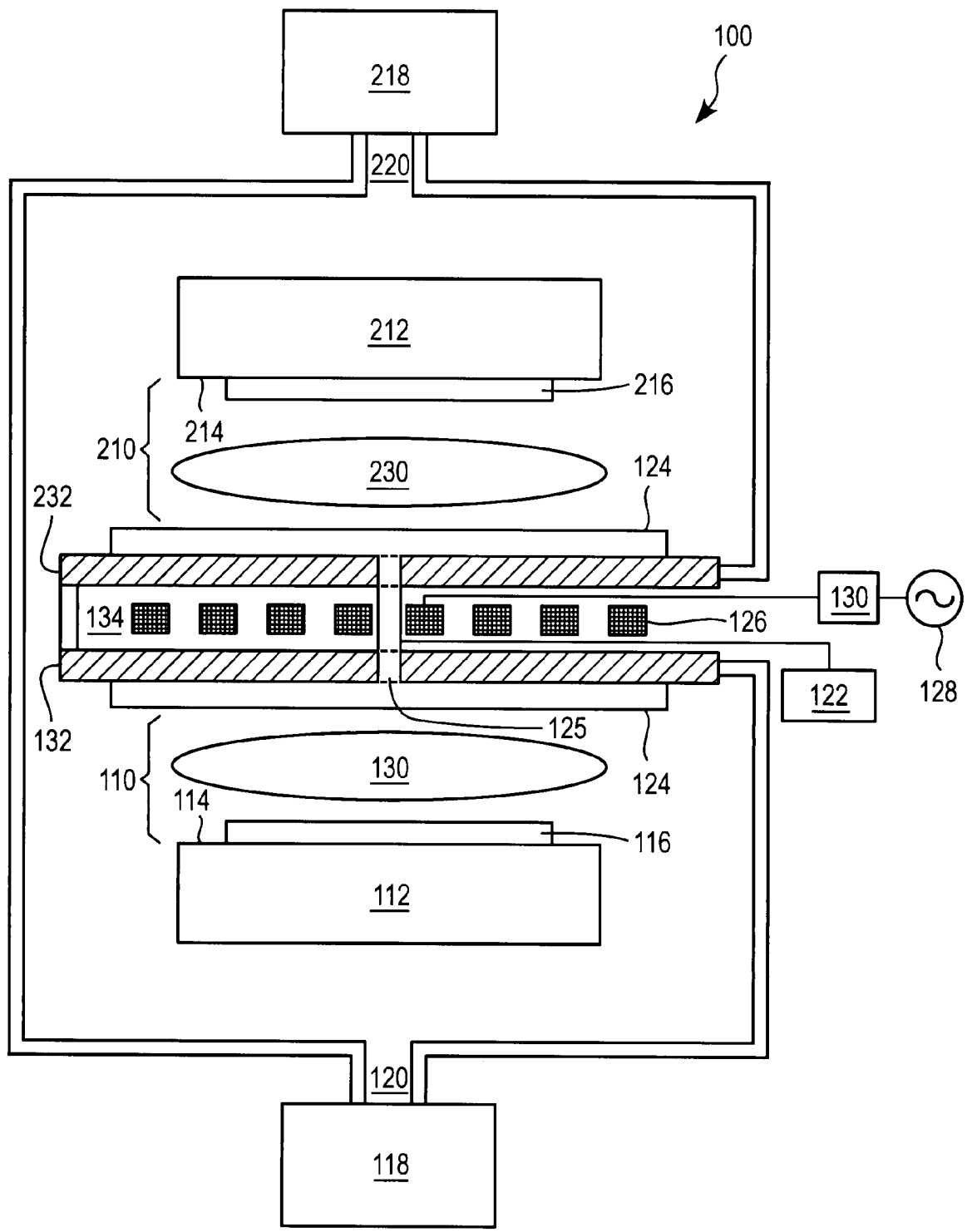
FIG. 2 is a cross-sectional view of an inductively coupled dual zone plasma processing apparatus for processing two vertically spaced apart substrates in a horizontal configuration under the same processing conditions.

In order to increase production efficiency while minimizing power requirements, described herein is a novel dual zone plasma processing chamber which can simultaneously process two substrates on opposite sides of a single planar antenna. One approach for maximizing the symmetrical electromagnetic fields generated by planar antenna 18 is the dual-zone configuration of the FIG. 2 embodiment. FIG. 2 is a cross-sectional view of an embodiment of a dual-zone ICP plasma processing chamber 100, including zones 110, 210. Zones 110, 210 of processing chamber 100 include the spaces between dielectric windows 132, 232 and substrate supports 112, 212 with horizontal support surfaces 114, 214, respectively. Support surfaces 114, 214 are adapted to support substrates 116, 216 in a horizontal position. Substrate supports 112, 212 can be supported in a cantilever manner by support arms extending from the chamber walls and are diametrically opposite one another in processing chamber 100.

Vacuum pumps 118, 218 are attached to pump ports 120, 220 to maintain the interior of processing chamber 100 at a low pressure (e.g., between about 1 mTorr to about 50 mTorr).

Pump ports 120, 220 are adjacent to substrate supports 120, 220 and can be diametrically opposite one another in processing chamber 100.

Common gas source 122 supplies process gases to the interior of processing chamber 100 to zones 110, 210. Process gases can be introduced into any suitable gas distribution arrangement, e.g. a dual-ended gas injector or distribution member 124 adjacent to substrates 116, 216, respectively. Use of the common gas source 122 and gas distribution members 124 ensure delivery of the same gas compositions to zones 110 and 210. The gas distribution arrangement can include two gas distribution members (e.g., gas distribution rings, gas distribution plates or gas injection nozzles) in fluid communication with one another and connected by a common passage 125, extending through an opening in dielectric windows 132, 232. Such gas distribution members are also described, for example, in commonly-owned U.S. Pat. Nos. 6,184,158 and 6,230,651, which are incorporated by reference in their entirety. The location of pump ports 120, 220 and vacuum pumps 118, 218 at opposite ends of the chamber 100 facilitates distribution of the process gas uniformly across the surfaces of substrates 116, 216.

Substrates 116, 216 are held in place on substrate supports 112, 212. The substrate supports can include electrostatic chucks (ESC), mechanical clamps, or other clamping mechanisms. Such substrate supports are also described, for example, in commonly-owned U.S. Pat. Nos. 5,262,029 and 5,838,529, which are incorporated by reference in their entirety. Substrate supports 112, 212 can also include an RF biasing electrode (not shown). For temperature control of the substrates 116, 216, the substrates 116, 216 can be cooled by flowing helium gas beneath the substrate and the substrate supports 112, 212 can be liquid cooled (not shown). Such temperature control is described in commonly owned U.S. Pat. No. 6,140,612, which is incorporated by reference in its entirety.

Once process gases are introduced into the interior of processing zones 110, 120, they are energized into a plasma state by a single external planar antenna 126 which supplies RF energy in opposite directions into zones 110, 120 in the interior of the processing chamber 100. The external planar antenna 126 is powered by a single RF source 128 and RF impedance matching circuitry 130 to inductively couple RF energy into processing chamber 100. The symmetric electromagnetic field generated above and below planar antenna 126 by the application of RF power energizes the process gases to form high-density plasmas 130, 230 (e.g., $10^{11}$-$10^{12}$ ions/cm$^3$) in zones vertically adjacent to substrates 116, 216. The configuration of processing chamber 100 has the potential of doubling the substrate processing throughput within the footprint of a chamber used for single substrate processing and without the expenditure of additional RF energy which would be required for running two processing chambers.

The single external planar antenna 126 can comprise one or more planar spiral coils or other configurations such as a series of concentric rings. A planar coil can be scaled-up by employing a longer conductive element to increase the antenna diameter and therefore accommodate larger substrates such as 300 mm wafers or multiple coils arranged in a planar array could be used to generate a uniform plasma over a wide area, such as for flat panel display processing.

The external planar antenna 126 is located in a space 134 which is at ambient pressure (i.e., atmospheric pressure). The space 134 is between dielectric window 132 and dielectric window 232. Dielectric windows 132, 232 can be composed of any dielectric material that is transparent to RF energy, such as quartz. Dielectric window 132 underlies planar antenna 126 and forms an upper wall relative to zone 110. Likewise, dielectric window 232 overlies planar antenna 126 and forms a lower wall relative to zone 210. In one embodiment, space 134 is enclosed in a metallic compartment supporting dielectric windows 132, 232 as walls of the compartment.

When substrates 116, 216 are processed in processing chamber 100, the RF source 128 supplies the antenna 126 with RF current preferably at a range of about 100 kHz-27 MHz, and more preferably at 13.56 MHz.

Figure 3:
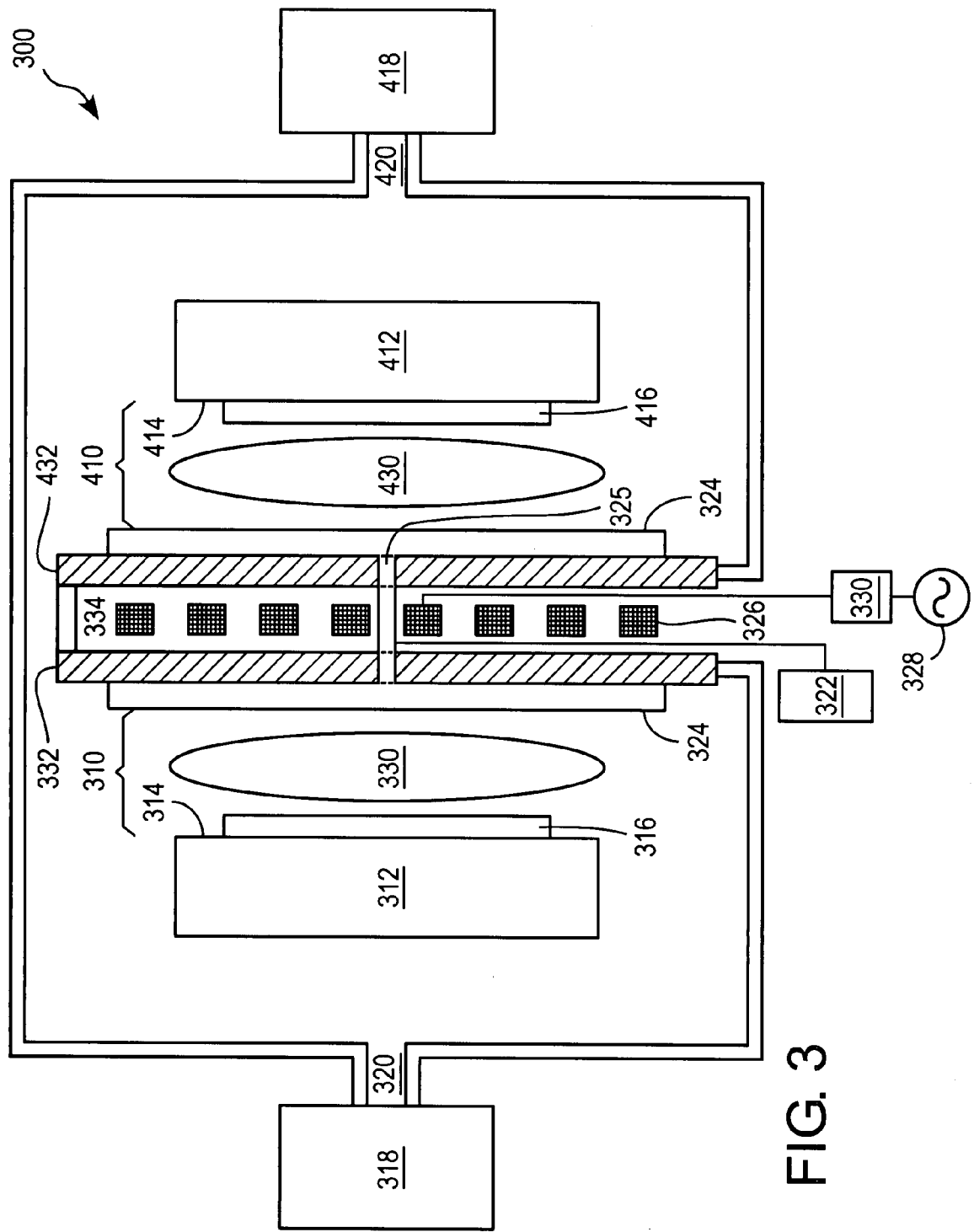
FIG. 3 is a cross-sectional view of an inductively coupled plasma processing apparatus for processing two horizontally spaced apart substrates in a vertical configuration under the same processing conditions.

FIG. 3 is a cross-sectional view of another embodiment of a dual-zone ICP plasma processing chamber 300, including zones 310, 410. Other than the orientation of the processing chamber 100, the configuration of plasma processing chamber 300 is similar to the plasma processing chamber 100 in FIG. 2. Zones 310, 410 of processing chamber 300 include the spaces between dielectric windows 332, 432 and substrate supports 312, 412 with vertical support surfaces 314, 414, respectively. Support surfaces 314, 414 are adapted to support substrates 316, 416 in a vertical position. Substrate supports 312, 412 are preferably diametrically opposite one another in processing chamber 300. Vacuum pumps 318, 418 are attached to pump ports 320, 420 to maintain the interior of processing chamber 300 at a low pressure (e.g., between about 1 mTorr to about 50 mTorr). Pump ports 320, 420 are adjacent to substrate supports 312, 412 and are preferably diametrically opposite one another in processing chamber 300.

Common gas source 322 supplies process gases to the interior of processing chamber 300. Process gases can be introduced into any suitable gas distribution arrangement, e.g. a dual-ended gas injector or distribution member 324 adjacent to substrates 316, 416, respectively. The gas distribution arrangement can include two gas distribution members (e.g., gas distribution rings, gas distribution plates or gas injection nozzles) in fluid communication with one another and connected by a common passage 325, extending through an opening in dielectric windows 332, 432.

Substrates 316, 416 are held in place on substrate supports 312, 412. The substrate supports can include electrostatic chucks (ESC), mechanical clamps, or other clamping mechanisms. Substrate supports 312, 412 can also include an RF biasing electrode (not shown). For temperature control of the substrates 316, 416, the substrates 316, 416 can be cooled by flowing helium gas beneath the substrates and the substrate supports 316, 416 can be liquid cooled (not shown).

Once process gases are discharged into the interior of processing zones 310, 410, they are energized into a plasma state by a single antenna arrangement supplying energy into the interior of the processing chamber 300. Preferably, the energy source is an external planar antenna 326 powered by an RF source 328 and RF impedance matching circuitry 330 to inductively couple RF energy into processing chamber 300. The symmetric electromagnetic field generated by planar antenna 326 through the application of RF power energizes the process gas to form high-density plasmas 330, 430 (e.g., $10^{11}$-$10^{12}$ ions/cm$^3$), laterally adjacent to substrates 316, 416. Similar to processing chamber 100 of FIG. 2, the configuration of processing chamber 300 has the potential of doubling the substrate processing throughput without the expenditure of additional RF energy.

The external planar antenna 326 is supported in space 334 which is at ambient pressure between dielectric window 332 and dielectric window 432. Dielectric windows 332, 432 can be composed of any dielectric material that is transparent to RF energy, such as quartz. Dielectric window 332 is laterally adjacent to planar antenna 326 and forms a side wall relative to zone 310. Likewise, dielectric window 432, also laterally adjacent to planar antenna 326, forms a side wall relative to zone 410. In one embodiment, space 334 is enclosed in a metallic compartment supporting dielectric windows 332, 432 as walls of the compartment.

Figure 4:
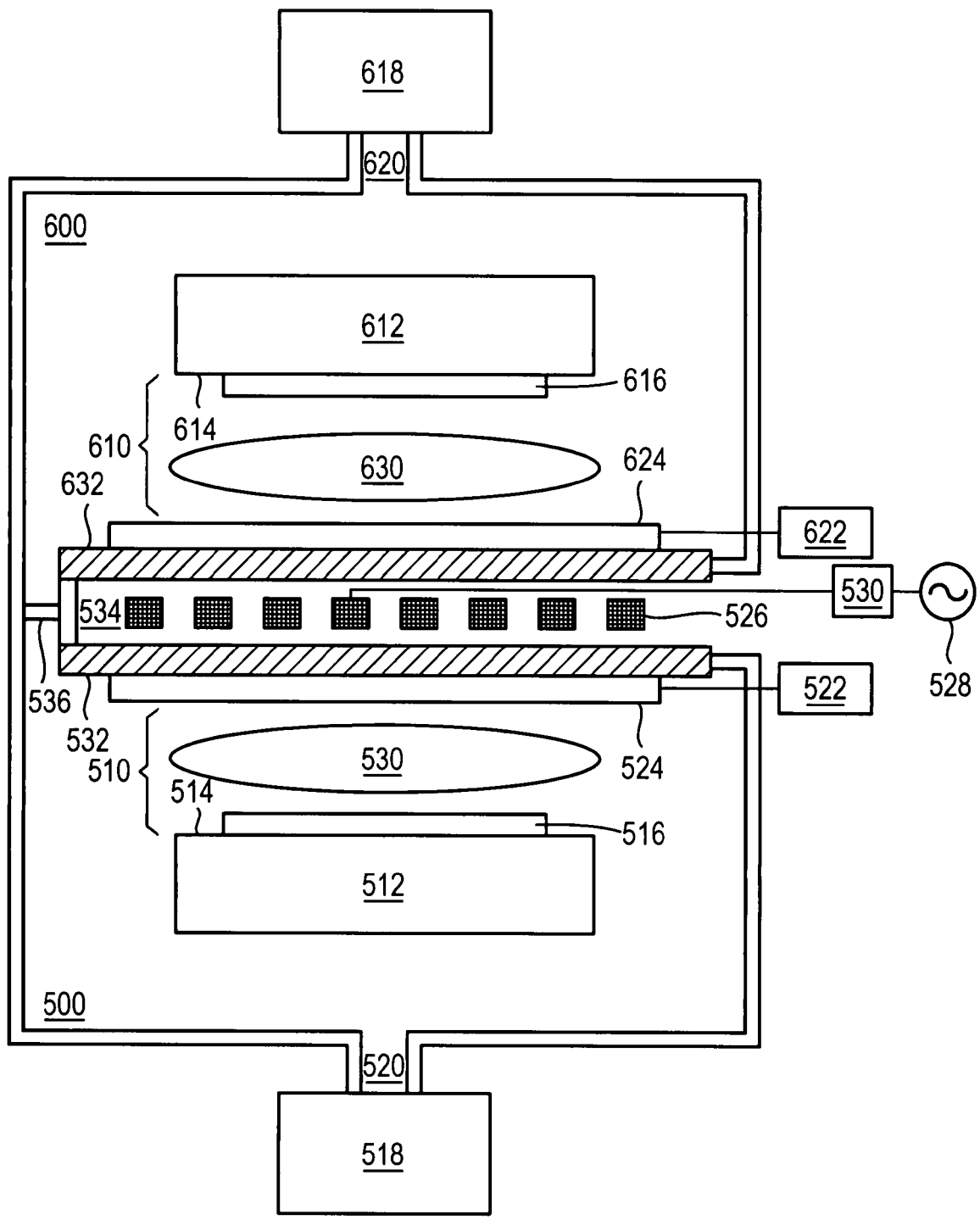
FIG. 4 is a cross-sectional view of an inductively coupled plasma processing apparatus for processing two vertically spaced apart substrates in a horizontal configuration under different processing conditions.

FIG. 4 is a cross-sectional view of another embodiment of a dual-zone ICP plasma processing chamber having sub-chambers 500, 600, including zones 510, 610, to simultaneously process two substrates under different processing conditions. Similar to the FIG. 2 embodiment, the configuration of processing sub-chambers 500, 600 includes horizontal support surfaces 514, 614.

Zones 510, 610 of sub-chambers 500, 600 include the spaces between dielectric windows 532, 632 and substrate supports 512, 612 with horizontal support surfaces 514, 614, respectively. Support surfaces 514, 614 are adapted to support substrates 516, 616 in a horizontal position. Substrate supports 512, 612 can be diametrically opposite one another. Vacuum pumps 518, 618 are attached to pump ports 520, 620 to maintain the interior of processing chamber 300 at a low pressure (e.g., between about 1 mTorr to about 50 mTorr). Pump ports 520, 620 are adjacent to substrate supports 512, 612 and can be diametrically opposite one another.

Gas sources 522, 622 supply process gases to the interior of processing chamber 300. Process gases can be introduced into the gas distributions members 524, 624 adjacent to substrates 516, 616. If substrates 516, 616 are subjected to different plasma processing conditions, gas sources 522, 622 can supply different gas recipes. For example, substrate 516 can undergo an etching process, while substrate 616 undergoes a chemical vapor deposition process and vice versa. Examples of etching processes include conductor etching, dielectric etching or photoresist stripping. Examples of deposition processes include the chemical vapor deposition of dielectric or conductive films. Gas distribution member 524, 624 can include gas distribution rings, gas distribution plates or gas injection nozzles. The process gases in zones 510, 610 are energized upon supplying RF energy to planar antenna 526, forming plasmas 530, 630 for the plasma processing of substrates 516, 616.

If different process gases from gas sources 522, 622 are used to generate plasmas 530, 630, it becomes necessary to isolate processing sub-chambers 500, 600 with partition 536. Because different gas chemistries are used to generate plasmas 530, 630 and produce different by-products, in the absence of partition 536, the different process gases released from gas distribution members 524, 624 and by-products of the processing may diffuse towards unintended regions of the processing chambers 500, 600, rather than uniformly over the surface of substrates 516, 616.

Substrates 516, 616 are held in place on substrate supports 512, 612. The substrate supports can include electrostatic chucks (ESC), mechanical clamps, or other clamping mechanisms. Substrate supports 512, 612 can also include an RF biasing electrode (not shown). For temperature control of the substrates 516, 616, the substrates 516, 616 can be cooled by flowing helium gas beneath the substrates and the substrate supports 516, 616 can be liquid cooled (not shown).

Once process gases are discharged into the interior of processing zones 510, 610, they are energized into a plasma state by a single antenna arrangement supplying energy into the interior of the processing chambers 500, 600. Preferably, the energy source is an external planar antenna 526 powered by an RF source 528 and RF impedance matching circuitry 530 to inductively couple RF energy into processing chambers 500, 600. The symmetric electromagnetic field generated by planar antenna 526 through the application of RF power energizes the process gas to form high-density plasmas 530, 630 (e.g., $10^{11}$-$10^{12}$ ions/cm$^3$), laterally adjacent to substrates 516, 616. Similar to processing chambers 200, 300 of FIGS. 2 and 3, the configuration of processing chambers 500, 600 has the potential of doubling the substrate processing throughput without the expenditure of additional RF energy.

The external planar antenna 526 is supported in space 534 which is at ambient pressure between dielectric window 532 and dielectric window 532. Dielectric windows 532, 632 can be composed of any dielectric material that is transparent to RF energy, such as quartz. Dielectric window 532 is laterally adjacent to planar antenna 526 and forms a top wall relative to zone 510. Likewise, dielectric window 632, also laterally adjacent to planar antenna 526, forms a bottom wall relative to zone 610. In one embodiment, space 534 is enclosed in a metallic compartment supporting dielectric windows 532, 632 as walls of the compartment.

In another embodiment for simultaneously process two substrates under different processing conditions, the configuration of the processing sub-chambers to can include vertical support surfaces, similar to the FIG. 3 embodiment.

While the invention has been described in detail with reference to specific embodiments thereof, it will be apparent to those skilled in the art that various changes and modifications can be made, and equivalents employed, without departing from the scope of the appended claims.

What is claimed is:

1. A dual zone plasma processing chamber, comprising:
   a first substrate support having a first support surface adapted to support a first substrate within the processing chamber;
   a second substrate support having a second support surface adapted to support a second substrate within the processing chamber;
   one or more gas sources in fluid communication with one or more gas distribution members supplying process gas to a first zone adjacent to the first substrate support and a second zone adjacent to the second substrate support; and
   a radio-frequency (RF) antenna adapted to inductively couple RF energy into the interior of the processing chamber and energize the process gas into a plasma state in the first and second zones, wherein the antenna is located between the first substrate support and the second substrate support
   wherein the first support surface is parallel to the second support surface and the antenna is a planar antenna oriented parallel to the first and second support surfaces.

2. The plasma processing chamber of claim 1, wherein the antenna is a planar coil in a compartment at ambient pressure.

3. The plasma processing chamber of claim 2, wherein the compartment is between first and second dielectric windows, the first dielectric window positioned between the planar coil and the first support surface and the second dielectric window positioned between the planar coil and the second support surface.

4. The plasma processing chamber of claim 3, wherein the planar coil inductively couples RF power through the first dielectric window to form a first plasma in the first zone between the first dielectric window and the first support surface; and inductively couples RF power through the second dielectric window to form a second plasma in the second zone between the second dielectric window and the second support surface.

5. The plasma processing chamber of claim 3, wherein the first and second dielectric windows are transparent to RF energy.

6. The plasma processing chamber of claim 3, wherein the one or more gas distribution members comprise a dual-ended injector extending through the first dielectric window and the second dielectric window, wherein the one or more gas sources supplies the same process gas to the dual-ended injector.

7. The plasma processing chamber of claim 3, wherein the one or more gas distribution members includes a first gas distribution member adjacent to the first dielectric window and a second gas distribution member adjacent to the second dielectric window, wherein the one or more gas sources includes a first gas source and a second gas source, the first gas source supplying a first process gas to the first gas distribution member and the second gas source supplying a second process gas to the second gas distribution member.

8. The plasma processing chamber of claim 7, wherein the first and second gas distribution members are gas distribution rings, gas distribution plates or gas injection nozzles.

9. The plasma processing chamber of claim 7, wherein the plasma processing chamber includes separate sub-chambers, the first substrate support and second substrate support being located in the separate sub-chambers.

10. The plasma processing chamber of claim 1, wherein the antenna is located midpoint between the first and second substrate supports.

11. The plasma processing chamber of claim 1, wherein the first support surface, and second support surface are vertically spaced apart.

12. The plasma processing chamber of claim 1, wherein the first support surface and second support surface are horizontally spaced apart.

13. The plasma processing chamber of claim 1, wherein the first and second substrate supports include electrostatic chucks or mechanical clamps.

14. The plasma processing chamber of claim 1, further comprising a first pump port adjacent to the first substrate support and a second pump port adjacent to the second substrate support, the first pump port being diametrically opposite to the second pump port.

* * * * *